United States Patent
Eberlein

(10) Patent No.: US 7,236,015 B2
(45) Date of Patent: Jun. 26, 2007

(54) DYNAMIC BIASING CIRCUIT FOR CONTINUOUS TIME COMPARATORS

(75) Inventor: Matthias Eberlein, Gilching (DE)

(73) Assignee: Dialog Semiconductor GmbH, Kirchheim Iteck-Nabern (DE)

(*) Notice: Subject to any disclaimer, the term of this patent is extended or adjusted under 35 U.S.C. 154(b) by 0 days.

(21) Appl. No.: 10/124,053

(22) Filed: Apr. 17, 2002

(65) Prior Publication Data

US 2004/0027169 A1  Feb. 12, 2004

(30) Foreign Application Priority Data

Apr. 2, 2002  (EP)  .................................  02392006

(51) Int. Cl.
    *H03K 5/22*  (2006.01)
(52) U.S. Cl. .......................... 327/65; 327/66
(58) Field of Classification Search ................. 327/50, 327/53, 54, 63, 65, 66, 67, 170, 307, 270, 327/563, 78, 79, 58, 62, 544, 530, 541, 543; 323/315–317; 330/259–261
    See application file for complete search history.

(56) References Cited

U.S. PATENT DOCUMENTS

| | | | | |
|---|---|---|---|---|
| 5,276,369 | A | 1/1994 | Hayakawa et al. | ............ 327/63 |
| 5,471,171 | A | 11/1995 | Itakura et al. | ............... 330/253 |
| 5,714,906 | A * | 2/1998 | Motamed et al. | ............ 327/563 |
| 5,834,974 | A | 11/1998 | Kim | ............................. 330/253 |
| 6,028,458 | A | 2/2000 | Hamaguchi | .................. 327/89 |
| 6,204,654 | B1 | 3/2001 | Miranda et al. | ............ 323/316 |
| 6,229,350 | B1 | 5/2001 | Ricon-Mora | .................. 327/77 |
| 6,239,658 | B1 | 5/2001 | Tham | .......................... 330/279 |
| 6,356,121 | B1 | 3/2002 | Garnier | ........................ 327/66 |
| 6,377,085 | B1 * | 4/2002 | Giuroiu | ........................ 327/66 |

OTHER PUBLICATIONS

"Adaptive Biasing CMOS Amplifiers", Degrauwe et al., IEEE Journal of Solid-State Circuits, vol. SC-17, No. 3, Jun. 1982, pp. 522-528.

(Continued)

*Primary Examiner*—Long Nguyen
(74) *Attorney, Agent, or Firm*—Saile Ackerman LLC; Stephen B. Ackerman

(57) ABSTRACT

A method for dynamically adapting the biasing current for a fast switching CMOS comparator is achieved. The difference of the two input signals of said comparator controls the comparator's biasing current, where the biasing current is high only when the difference is low and the comparator's switching is likely to happen and where the biasing current is kept low at other times. In a current mirroring circuit, the voltage difference at the comparator inputs controls the mirroring ratio. The biasing current reaches its maximum when the input voltage difference approaches zero. Once the input voltage difference crosses zero and continues to change in the same direction as before, that is after the polarity of the voltage difference changed, the control mechanism alternates the connection of the comparator input signals to the current controlling elements, in order to now reduce the current with a further increase of the voltage difference. The same circuit can have opposite characteristics, providing a minimum current when the input voltage difference is low, by reversing the connection of the inputs to the current controlling elements. An alternative circuit is described, that does not need said alternating mechanism.

55 Claims, 4 Drawing Sheets

OTHER PUBLICATIONS

"Dynamic CMOS Amplifiers", Hosticka, IEEE Journal of Solid-State Circuits, vol. SC-15, No. 5, Oct. 1980, pp. 887-894.

"A Very-High-Slew-Rate CMOS Operational Amplifier," by R. Klinke et al., IEEE Journal of Solid-State Circuits, vol. 24, No. 3, Jun. 1989, New York, U.S., pp. 744-746.

"CMOS Operational Amplifier with Nearly Constant Setting Time," by R. Klinke et al., IEE Proceedings, vol. 137 Pt G; No. 4, Aug. 1990, pp. 309-314.

* cited by examiner

DYNAMIC BIASING CIRCUIT FOR CONTINUOUS TIME COMPARATORS

BACKGROUND OF THE INVENTION (1) Field of the Invention

The invention relates to a fast switching continuous time CMOS comparator with dynamic biasing circuit, and more particularly, to a continuous time comparator having a dynamic biasing circuit which self-adjusts the biasing current, depending on the voltage difference of the two input signals of the comparator, in order to draw high biasing current only when required and still maintaining overall low power consumption.

(2) Description of the Prior Art

Continuous time CMOS comparators use high bias currents to achieve high speed switching characteristics. Since it is unknown when the switching point is being reached, bias current is always left at its high level, causing high overall power consumption.

Several patents describe the use of dynamic or adaptive or self-adjusting bias currents, however, none of them uses such an adaptive method to get high bias currents at the time when switching is likely to happen and to reduce said bias current at other times.

U.S. Pat. No. 6,204,654 (Miranda, et al.) dicloses a dynamically boosted current source circuit to improve the response speed of a circuit responsive to a transitioning input signal. A threshold detector detects the occurrence of an input signal transition prior to its detection by the responsive circuit, and triggers the current source to provide the boosted current; this improves the responsive circuit's speed. The current source provides the boosted current for a predetermined time interval, or until the input signal crosses a second threshold, enabling response speed to be increased without a significant increase in supply current.

U.S. Pat. No. 5,471,171 (to Itakura, et al.) describes an amplifier device capable of realizing high slew rate with low power consumption. It includes a determination element for determining a change condition of the level change of the input signal to generate a control signal corresponding to said change condition and a driving capability increase element as a circuit for increasing a bias current, depending on said change condition, in order to increase the driving output supplied.

U.S. Pat. No. 6,239,658 (to Tham) shows a control circuit, which is used to increase the DC, current of a low noise amplifier for a mobile wireless communication system in the presence of jamming signal to preserve high dynamic range. The difference signal between the input signal with jamming signal and the average input is detected by a peak detector.

The following articles discuss subjects close to the invention:

"Adaptive Biasing CMOS Amplifiers", (Degrauwe, Rijmenants, Vittoz and De Man, IEEE Journal of Solid-State Circuits, Vol SC-17, No. 3 Jun. 1982 pp 887) discusses two transconductance amplifiers in which the concept of an input dependent bias current is introduced.

"Dynamic CMOS Amplifiers", (Hosticka, IEEE Journal of Solid-State Circuits, Vol SC-15, No. 5 Oct. 1980, pp 522) presents the concept of dynamic amplifiers with different biasing principles.

SUMMARY OF THE INVENTION

A principal object of the invention is to reduce the current consumption of a fast switching comparator. A basic requirement is however to supply a high biasing current at least at the time when switching actually takes place, in order to maintain the required fast switching speed. Three concepts for similar solutions are presented in the following.

In accordance with the objectives of this invention and in a first concept, a circuit to feed a high biasing current into said comparator only at the time when switching is likely to happen, and significantly reducing the biasing current at all other times, while maintaining the fast switching speed, is achieved. The circuit provides the biasing current for a fast switching comparator, typically a fast CMOS comparator, and comprises a reference current source, a current mirror to mirror said reference current into a second current, which is then provided to said fast CMOS comparator as said comparator's biasing current. The first branch of said current mirror taking said reference current is hereafter called the reference current branch and the second branch of said current mirror producing said biasing current is hereafter called the biasing current branch. The current mirrored from said reference current branch into said biasing current branch may be either equal to or a predefined multiple of said reference current. Furthermore the circuit comprises a circuit arrangement to modify the current mirroring ratio with voltage controlled resistive elements, depending on the two input signals' voltage difference. Furthermore it provides the connection from said two input signals to the ratio controlling inputs of the circuit with said voltage controlled resistive elements, which modifies the current mirroring ratio in a way, that the biasing current is reduced, when said two input signals' voltage difference increases. In addition it provides the mechanism, to alternate the connection of the two input signals to the proper ratio controlling inputs of said resistive elements, and it provides the means to control said alternating mechanism. The fast switching comparator itself is not considered as being a part of the circuit to supply a variable biasing current. The input signals to the fast switching comparator are also the input signals to the circuit to provide the biasing current for said fast switching comparator; i.e. the input signals to said fast switching comparator and to said circuit to provide the biasing current for said fast switching comparator are identical.

To determine, when the alternating mechanism needs to be switched, the polarity of the input voltage at the two inputs to the fast switching comparator needs to be monitored; therefore the circuit of the presented invention requires the availability of a voltage comparing function for its operation, which provides a selection signal to the means to control an alternating mechanism. Said voltage comparing function can be implemented as a real voltage comparator circuit. However, as both comparators are connected to the same inputs and as they therefore switch at the same time under the same condition, the (external) fast switching comparator can take over the role of an (internal) voltage comparator, making an internal comparator obsolete.

More specific, the circuit to provide said biasing current for said fast switching comparator comprises a reference current source, a current mirror, typically built by pairs of transistors, to mirror the reference current from said reference current branch into a second current branch, which embodies the biasing current branch and a connection to feed said biasing current into said fast switching comparator as the comparator's biasing current. The current mirrored into the biasing current branch may be either equal to or a predefined multiple of the reference current. Furthermore it comprises first voltage controlled resistive element to modify the current mirroring ratio, connected in series with one of the said current mirror branches, the reference current branch and controlled by one of said two Input signals and a second voltage controlled resistive element to modify the current mirroring ratio, connected in series with the other of said current mirror branches, the biasing current branch, and controlled by the other of said two input signals. Furthermore it provides the connection from said two input signals to the two ratio controlling inputs of the circuit with said resistive elements which modifies the current mirroring ratio in a way, that the biasing current is reduced, when said two input signals' voltage difference increases. Said connection, from said two input signals to said two ratio controlling inputs of said resistive elements, may or may not incorporate a level shifting function to couple said two input signals to said two ratio controlling inputs. In addition it provides a matrix of switching elements to alternate said connection of said two input signals to said two ratio controlling inputs of said resistive elements. And further the circuit provides the means to control said matrix of switching elements, which also uses a voltage comparing function to determine the actual polarity of said voltage difference of said fast switching comparators two input signals. The voltage comparing function to determine the actual polarity of said voltage difference of said fast switching comparator's two input signals may be implemented as a voltage comparator inside the circuit of this invention, or it may simply use the output status provided by said fast switching comparator itself as a substitution for such internal voltage comparator by coupling the output of said fast switching comparator to said means to control said matrix of switching elements. Such coupling means could incorporate some level shifting or "electronic glue" components.

In accordance with the objectives of this invention, a method to feed a high biasing current into said comparator only at the time when switching is likely to happen, and significantly reducing the biasing current at all other times, is achieved. First a reference current is mirrored into a second branch, which provides the biasing current for said fast switching comparator. Two voltage controlled resistive elements, one in series with each current mirror branch, modify the current mirroring ratio, thus changing the biasing current. The two voltage controlled resistive elements are controlled by the two input signals of the fast switching comparator. When the voltage difference of said two input signals is zero, the biasing current will be equal to or a predefined multiple of the mirrored reference current. Furthermore, to achieve the objectives of this invention, a method to connect one of said two ratio controlling inputs of said resistive elements with one of said two inputs of said fast switching comparator and to connect the other of said two ratio controlling inputs of said resistive elements with the other of said two inputs of said fast switching comparator, is implemented in a way, that a higher voltage difference at the inputs will reduce the current in said biasing branch. After the input signal crossed the zero difference point, a control mechanism alternates the connection between the two comparator input signals and the two ratio controlling inputs of said resistive elements. The effect is, that the biasing current reaches its maximum value when the input voltage difference is zero; from that point on, when the absolute voltage difference at the two inputs becomes larger again, the biasing current is now reduced.

Under specific conditions the opposite characteristics of the current biasing circuit may be desired: the biasing current provided to the voltage comparator should be high when the input signal voltages are far apart and said current should be low when the input signal voltages are close together. Therefore a second concept of the invention is to feed a high biasing current into a comparator only at the time when the difference of the input signal voltage is high and to keep the biasing current low, when the input signal voltages are close together. Said variable biasing current will have its maximum when a voltage difference of said CMOS comparator's two input signals is close to said comparator's full operating range and will have its minimum when said voltage difference is zero In accordance with this specific objective for a characteristic opposite to the first concept, the same circuit as described above is used, where the connection from the inputs of the comparators to the current controlling branch however is reversed. Now a circuit to feed a high biasing current into a comparator only at the time when the difference of the input signal voltage is high and to keep the biasing current low, when the input signal voltages are close together, is achieved. This circuit again, provides the biasing current for a fast switching comparator, typically a CMOS voltage comparator and comprises a circuit to mirror a reference current from said reference current branch into a second current branch and to feed said mirrored current into said comparator circuit as its biasing current, a circuit arrangement to modify the current mirroring ratio depending on said comparator input signals' voltage difference. To achieve the opposite characteristic, the circuit provides means to connect said comparator input signals to the circuit, which modifies the current mirroring ratio in a way, that the biasing current increases, when said comparator input signals' voltage difference increases. Furthermore it provides again an alternating mechanism, to determine which of said two input signals is connected to which ratio controlling input of said circuit arrangement to modify the current mirroring ratio of said current mirror and in addition, it provides the means to control the status of said alternating mechanism for said two input signals and said two ratio controlling inputs of said branches of the current mirroring circuit.

More specific, the circuit works to provide the biasing current for a voltage comparator, typically for a fast CMOS comparator and comprises a reference current source, a current mirror, typically built by pairs of transistors, to mirror the reference current from said reference current branch into a second current branch and a connection to feed this current into said comparator circuit as said comparator's biasing current. The current mirrored into said second branch, which embodies the biasing current branch, may be either equal to or a predefined multiple of the reference current. Furthermore the circuit comprises a first voltage controlled resistive element to modify the current mirroring ratio, in series with said reference current branch of said current mirror, controlled by a ratio controlling input and comprises a second voltage controlled resistive element to modify the current mirroring ratio, In series with said biasing current branch of said current mirror, controlled by a ratio controlling input. Furthermore it provides the connection from said two input signals to said two ratio controlling inputs of the circuit with said resistive elements which modifies the current mirroring ratio in a way, that the current increases, when said comparator input signals' voltage difference increases. In addition it provides a matrix of switching elements to alternate the connection of said two input signals to the proper ratio controlling inputs of said resistive elements and it provides the means to control said matrix of switching elements.

To achieve the objectives of this invention with said opposite characteristics for the current versus input voltage difference, a method to connect one of said two ratio controlling inputs of said resistive elements with one of said inputs of the comparator and to connect the other of said two ratio controlling inputs of said resistive elements with the other of said inputs of the comparator is reversed to the above described invention. Said method to connect is implemented in a way, that the higher voltage difference at the inputs will increase the current in the biasing current branch. The resulting biasing current versus the input voltage difference now has a minimum value, when the difference of said comparator input signals cross the zero voltage point.

A third concept for a circuit, with a different structure, but very similar to the first concept in its major operating characteristics, is disclosed in this invention. Twice as many current controlling elements are introduced. Then an alternating mechanism like in the first concept of the circuits is not required. A major advantage of a switchless solution is to avoid switching noise. Achievable power saving might be less. The circuit, according to this invention, works to provide the biasing current for a CMOS comparator and comprises a reference current source, a circuit to mirror the reference current from said reference current branch into a second current branch, which embodies the biasing current branch, and a circuit to feed said biasing current into said comparator circuit as said comparator's biasing current. Furthermore it comprises a circuit to modify the current mirroring ratio: one portion of this circuit is in series with one branch of said current mirror, the reference current branch, and is controlled by signals from both inputs of said comparator; another portion of this circuit is in series with the other branch of said current mirror, said biasing current branch, and is again controlled by signals from both inputs of said comparator. Furthermore it provides the connection from said comparator input signals to the ratio controlling inputs of the circuit, which modifies the current mirroring ratio. The resulting biasing current versus the input voltage difference, as in the first disclosed invention, has a maximum value, when the voltage difference of the input signals crosses the zero point.

More specific, the circuit provides the biasing current for a voltage comparator, typically a fast CMOS comparator and comprises a reference current source, a current mirror, typically built by pairs of transistors, to mirror the reference current from said reference current branch into a second current branch and a connection to feed this current into said comparator circuit as said comparator's biasing current. The current mirrored into the biasing current branch may be either equal to or a predefined multiple of the reference current. Furthermore it comprises a first voltage controlled resistive element to modify the current mirroring ratio, in series with said reference current branch of said current mirror and connected with one of the comparator's inputs and a second voltage controlled resistive element, parallel to the first resistive element, to modify the current mirroring ratio, in series with the same reference current branch of said current mirror and connected with the other of the comparator's inputs and a third voltage controlled resistive element to modify the current mirroring ratio, in series with the biasing current branch of said current mirror and connected with one of the comparator's inputs and a fourth voltage controlled resistive element, in series with the third resistive element, to modify the current mirroring ratio, in series with the biasing current branch of said current mirror and connected with the other of the comparator inputs. The connection from said comparator input signals to said ratio controlling inputs of said voltage controlled resistive elements is performed in a way, that the biasing current is reduced, when said comparator input signals' voltage difference increases.

To achieve the objectives of this invention, a method to feed a high biasing current into said comparator only at the time when switching is likely to happen, and significantly reducing the biasing current at all other times, is achieved. First a reference current is mirrored into a second branch, providing the biasing current for the CMOS comparator. Furthermore a method to modify the current mirroring ratio is realized through circuit components, operating as four groups of voltage controlled resistive elements: two groups in a parallel arrangement and in series with the reference current branch of said current mirror are controlled by either input of said comparator and two groups in a serial arrangement and in series with the biasing current branch of said current mirror are also controlled by either input of the said comparator. Furthermore, to achieve the objectives of this invention, methods to connect said comparator inputs with the groups of resistive elements are implemented in a way, that changes in the comparator input signals cause changes in the current mirror ratio; the current mirror is in balance when the voltage difference of the two input signals is close to zero. The effect is, that the biasing current reaches its maximum value when the input voltage difference is zero; from that point on, when the absolute voltage difference at the two inputs becomes larger again, regardless of its polarity, the biasing current is now reduced.

Summarizing the concepts of the invention, there are three distinct variations of a similar concept: first, a circuit feeding a variable biasing current to a fast switching comparator, typically a CMOS comparator, where said biasing current has its maximum when the voltage difference of said voltage comparator input signals approaches zero and alternating said connection between said two fast switching comparator's input signals and said two ratio controlling inputs of said voltage controlled resistive elements, which modify said current mirroring ratio, by means of a switching matrix, immediately after the zero difference point of said fast switching comparator input signals is crossed; second a similar concept where said biasing current has its minimum when the voltage difference of said voltage comparator input signals approaches zero, by just exchanging the connection between the two voltage comparator input signals and said two voltage controlled resistive elements; and third, another similar concept, that adds more components to circuit to modify the current mirroring ratio and that at the same time eliminates the need for the switching matrix of said alternating mechanism.

BRIEF DESCRIPTION OF THE DRAWINGS in the accompanying drawings, forming a material part of this description, there is shown:

Figure 1:
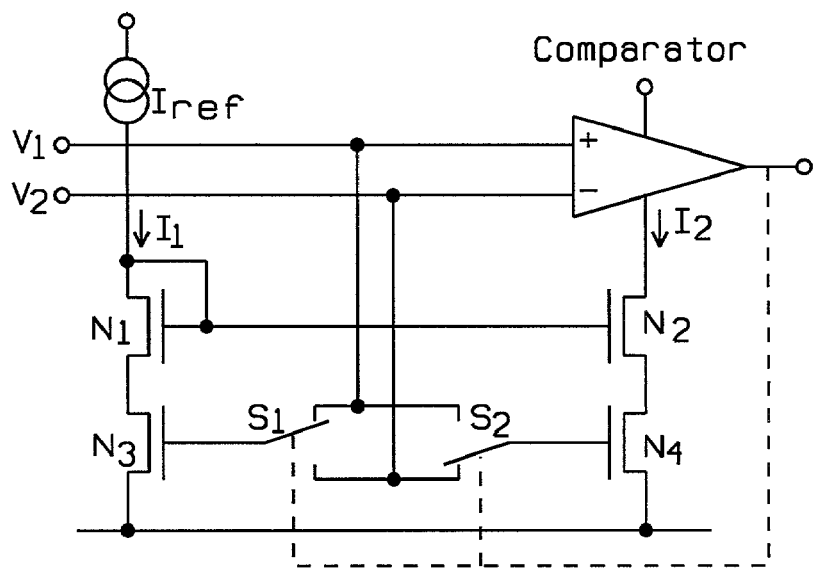
FIG. 1a and FIG. 1b are the basic circuit diagrams of the comparator, together with the biasing circuit, comprising the elements to generate and to control the biasing current.

DESCRIPTION OF THE PREFERRED
EMBODIMENTS

Continuous time CMOS comparators use high bias currents to achieve high speed switching characteristics. They draw high current even if the operating conditions make it very unlikely that switching may happen. The most important parameter is the switching speed; which directly depends on the biasing current at the time of switching. However, at times where switching is very unlikely to happen, the biasing current could be reduced; the overall power consumption would then be significantly lower. The preferred embodiments disclose a novel method and circuit to feed a high biasing current to said CMOS comparator only when switching is likely to happen and reduces said biasing current significantly at other times.

The disclosed invention uses the fact, that switching of a comparator will only happen when the voltage difference of the two comparator input signals is close to zero and that switching is unlikely to happen when the voltage difference of said two comparator input signals of the comparator is high to efficiently control the biasing current.

In all embodiments of the invention, a controllable current source will feed the biasing current into the comparator, where the current of said current source would be controlled by a circuit determining the voltage difference of said comparator inputs. Such current source may be represented by a current mirror, where the current mirroring ratio can be varied depending on the voltage difference of said comparator inputs.

According to the objectives of the invention, the biasing current should have its maximum just before zero crossing of the two comparator input signals of the fast switching comparator. As long as the voltage difference of said two comparator input signals decreases, said biasing current is increased. Once the input voltage difference crosses zero and continues to change in the same direction as before, so that the polarity of the voltage difference at the comparator inputs now has changed, the direction of change of said biasing current must reverse, i.e. the control mechanism of the variable current mirror must alternate its operation in order to now reduce the current with a further increase of the voltage difference. For this purpose the connection within said control mechanism from the comparator input signals to the controlling inputs of a variable current mirror will be alternated. The direction of change of said biasing current is hence determined by properly selecting the direction of change of said current mirroring ratio through that control mechanism.

A current mirror forms a heart of the circuit. In the original concept of current mirrors, with matched pairs of components, they mirror a reference current into an output current of equal value. However with appropriate means they can be designed to mirror the current as a defined multiple of the reference current. Said current mirror mirrors a reference current from a first current branch, here called a reference current branch, into a second current branch of said current mirror, here called a biasing current branch, and thus produces a current mirror output current, which is equivalent to said reference current multiplied by a current mirroring ratio. Said current mirror output current is then fed to said fast switching comparator as said biasing current through an appropriate connection. A current mirror may, for example, be built of a matched transistor pair and a reference current source.

A circuit arrangement to modify the current mirroring ratio of said current mirror, connected in series with said two branches of the current mirror and controlled by two signals, operating as ratio controlling inputs, provides the means to modify said current mirroring ratio. Modifying said current mirroring ratio then results in said biasing current being modified to a value, which is equivalent to said reference current multiplied by a modified current mirroring ratio. As presented in the first embodiment, voltage controlled resistive elements in series with each branch of said current mirror change the characteristics of the current mirror. The two branches of said current mirror and the two voltage controlled resistive elements, in series with each branch of the current mirror, can be considered to build a bridge circuit. These resistive elements are controlled by coupling said ratio controlling inputs to the two input signals of the fast switching comparator, in a way, that, when an input signal changes relative to the other, the balance of the current mirror will change, specifically, when the voltage difference of both signals gets smaller, said biasing current will increase. However when both input signals change together in common mode, the current mirror's balance remains unchanged.

The input signals to the fast switching comparator are also the inputs to the circuit of the presented invention, which discloses "a circuit to supply a variable biasing current to a fast switching comparator"; i.e. the inputs to said fast switching comparator and to said circuit to supply a variable biasing current to said fast switching comparator are identical.

The control mechanism within the circuit the presented invention comprises three major parts: first, a circuit to connect said two input signals to the two ratio controlling inputs of said circuit arrangement to modify the current mirroring ratio in a way, that the biasing current is reduced (or increased), when said two input signals' voltage difference increases (or decreases); Second, in the first and second embodiment of the presented invention, the control mechanism provides a matrix of switching elements to alternate said connection of said two input signals to said two ratio controlling inputs. The matrix of switching elements is comprised within the circuit to connect said two input signals to the two ratio controlling inputs. And third, it comprises the means to control said alternating mechanism, i.e. the logic to control said switch matrix. In addition, said connection, may or may not incorporate level shifting or "electronic glue" components to couple said two input signals to said two ratio controlling inputs. Finally, another important item is the means to determine the status of a comparison of said two input signals and further provide a signal indicating the polarity of said voltage difference of said two input signals to said means to control said alternating mechanism. It serves to decide on the appropriate direction of change of said biasing current. As explained later in this document, said means to determine the status of a comparison can be implemented in two ways: a comparator circuit could be integrated within the circuit of this invention or by reusing the available signal from said fast switching comparator's output to indicate the result of comparison In the first and second embodiment, to determine, when the alternating mechanism needs to be switched, the polarity of the input voltage at the inputs to the fast switching voltage comparator needs to be monitored; therefore the circuit of the presented invention requires a voltage comparing function for its own operation. Said voltage comparator function can be implemented as a real voltage comparator circuit. However, as both, such internal and the external, comparators are connected to the same inputs and as they therefore switch at the same time and under the same condition, the (external) fast switching comparator can easily take over the role of the (internal) voltage comparator, providing an appropriate signal to control said alternating mechanism and making an internal comparator obsolete. In essence, said comparating function can be implemented in two a comparator circuit could be integrated within "a circuit to supply a variable biasing current to a fast switching comparator" (see FIG. 1b) or, preferably, takes the available signal from said fast switching comparator's output to indicate the result of comparison and couples it to said means to control said alternating mechanism (see FIG. 1a). In the first case, said comparating function is inside, in the second case it is outside of the circuit of this invention.

Figure 1A:
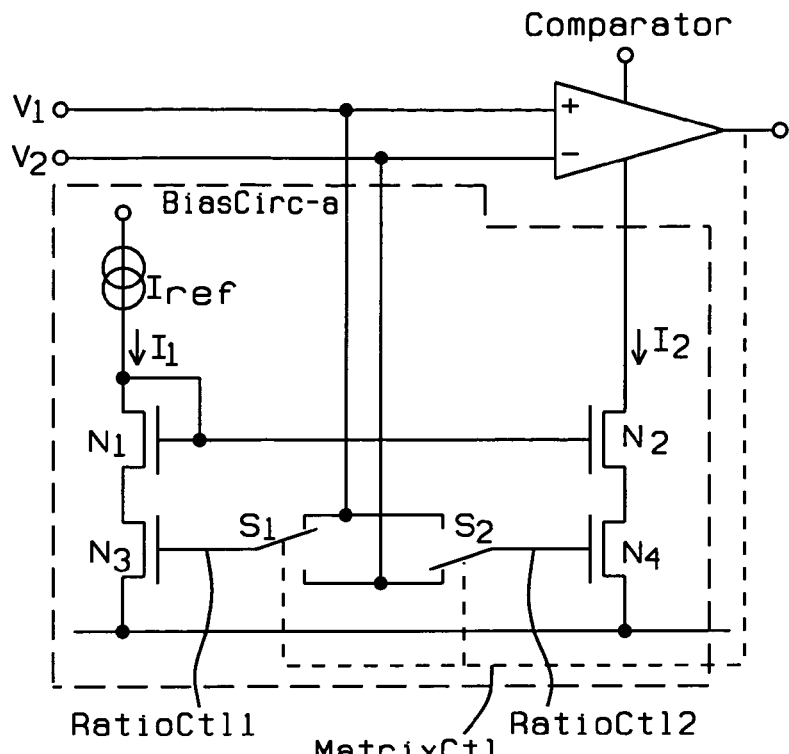
Figure 1B:
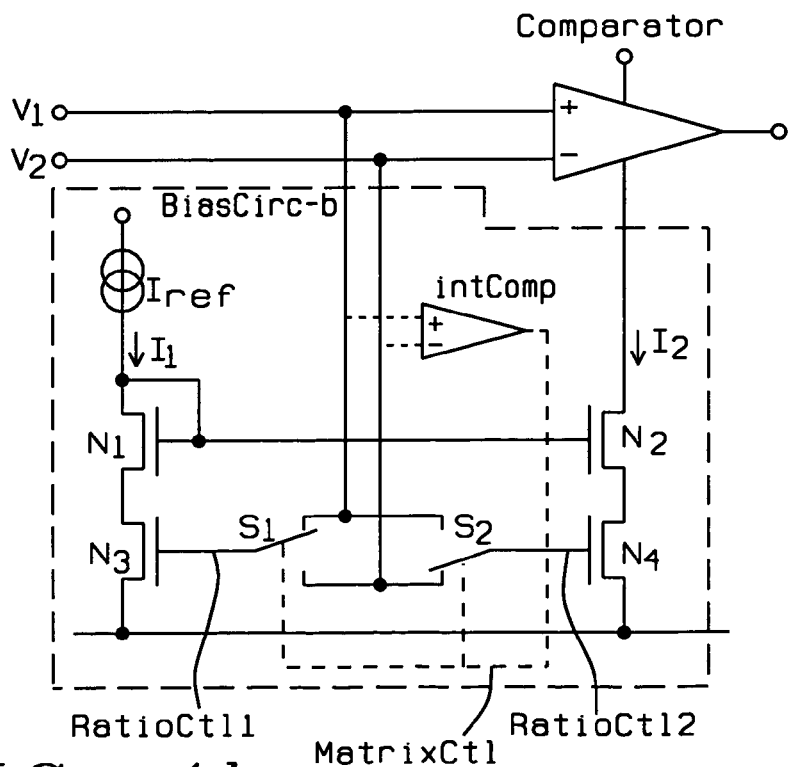

FIG. 1a and FIG. 1b show the principal concept of the circuit (BiasCirc-a and BiasCirc-b) to supply a variable biasing current to a fast switching comparator. Both figures show a reference current source $I_{ref}$ and a current mirror, built by the matched transistor pair $N_1$ and $N_2$, which receives the reference current as current $I_1$ in one branch, the reference current branch, and mirrors it into the other branch, the biasing current branch, as $I_2$. FIG. 1a and FIG. 1b show two possible implementations of the means to determine the status of a comparison of said two input signals: FIG. 1b shows the comparator circuit intComp integrated within the circuit to supply a variable biasing current to a fast switching comparator BiasCirc-b. FIG. 1a shows the version reusing the available output signal from said fast switching comparator Comparator. The signal to "indicate the result of comparison" and coupling said signal to said "means to control the alternating mechanism" is visualized with the dotted control line MatrixCtl.

The two transistors $N_3$ and $N_4$ in FIG. 1a and FIG. 1b operate as voltage controlled resistors and change the characteristics of the current mirror. Both gates of these transistors work as the two ratio controlling input RatioCtl1 and RatioCtl2 and are further connected through the alternating matrix to the two comparator inputs $V_1$ and $V_2$. Such connection may use a direct connection or through some level-shifting means.

The following functional description assumes a circuit according to FIG. 1a and FIG. 1b, where NMOS-transistors are used for all FET. If however PMOS-transistors should be used, all voltage levels will be reversed.

If the larger one of the two comparator input signals is connected to $N_3$ and the smaller one is connected to $N_4$, then current $I_2$ is smaller than $I_1$. If the comparator input signals approach each other, $I_2$ increases in an almost linear way. For the input signals $V_1$ equal $V_2$, the currents $I_1$ and $I_2$ become equal, too. $I_2$ is the biasing current fed into the comparator.

If the input signals continue to change in the same direction as before, then $I_2$ would further increase. Therefore shortly after the two input signals crossed zero difference and after the comparator output switched, the connection of the gates of transistors $N_3$ end $N_4$ will be alternated. After alternating the controlling connection, further, an increase of the input voltage difference will decrease the current $I_2$. Again $N_3$ is connected to the larger input signal with appropriate selection of said switching matrix.

Figure 2A:
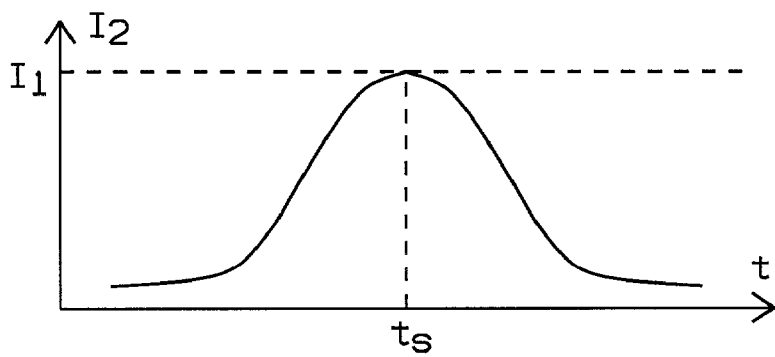
FIGS. 2a and 2b show the resulting biasing current $I_2$ versus the input voltage difference of signals $V_1$ end $V_2$, when the switching sequence is selected to produce a maximum current when the difference at signals $V_1$ and $V_2$ approaches zero.
Figure 2B:
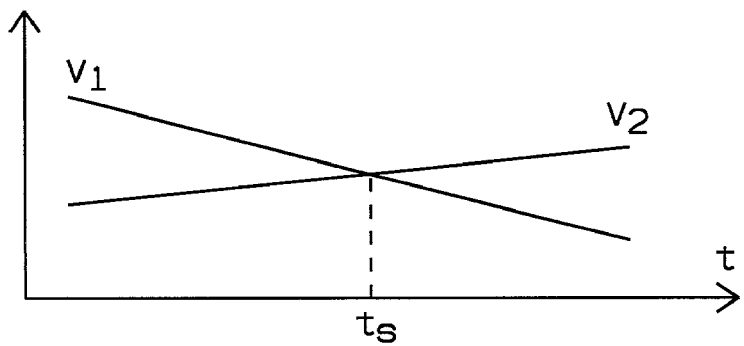

If the larger one of the two input signals is always connected to $N_3$ an effective "current boost" is realized during the switching event of the comparator. This characteristic of the biasing current versus input voltage difference is shown in FIG. 2a and FIG. 2b. When the input voltage $V_1$ and $V_2$ change over time t like in FIG. 2a, then the biasing current $I_2$ changes over time t as shown in FIG. 2b. The figure also shows the currents $I_1$ and $I_2$ being "in balance", at the point when the input voltages $V_1$ and $V_2$ cross each other.

Transistors $N_3$ and $N_4$ serve two major purposes in the circuit as described in this invention: they are the elements to control the current mirror ratio and they are, at the same time, the sensing elements for the input signal difference, thus being able to achieve the desired circuit function of significant biasing current reduction with a minimum of components. However $N_3$ and $N_4$ may also be built by a more complex arrangement of components. In addition the connection of comparator input signals to the controlling resistive elements may incorporate level shifting components.

Determining the point where said two input signals of said fast switching comparator crosses the zero difference condition is achieved by a voltage comparator, which then selects the status of said alternating mechanism, built by a matrix of switching elements and represented by S1 and S2 in FIG. 1a and FIG. 1b. Such means to determine the status of a comparison and to determine the actual polarity of said input signal's difference may be implemented as a voltage comparator inside the circuit of this invention, as shown in FIG. 1b, or it may preferably use, as indicated in FIG. 1a, the output status provided by said fast switching comparator itself as a substitution for such internal voltage comparator.

Figure 5:
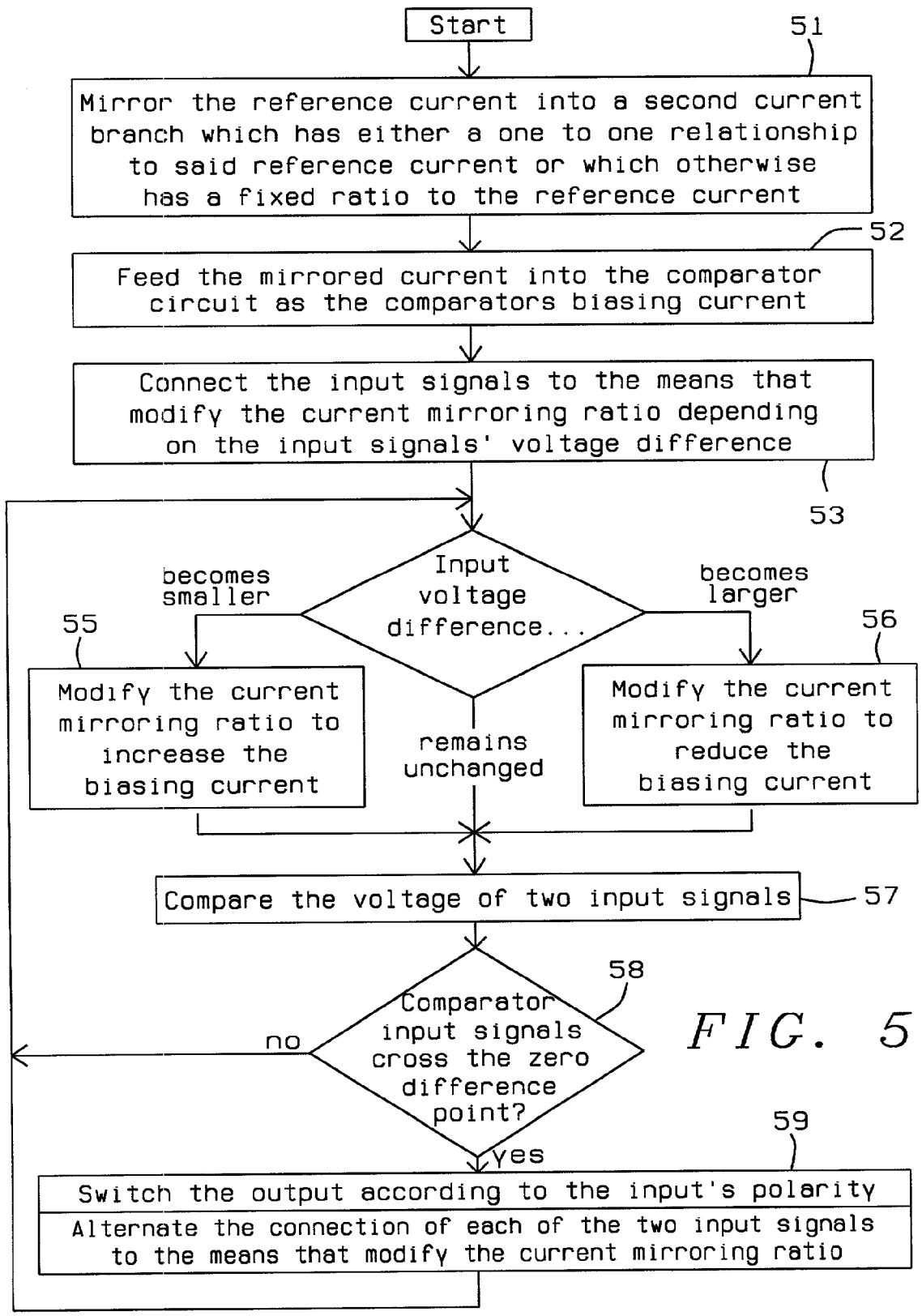
FIG. 5 shows the method to control the biasing current as a flow chart.

The method to achieve objectives of this invention is illustrated in FIG. 5. First, in step 51, the circuit mirrors the reference current into a second current branch. Then in step 52 said second current branch feeds the mirrored current into the comparator circuit as the comparators biasing current. It connects the input signals to the circuit arrangement, that modifies the current mirroring ratio in stop 53. If the input voltage difference becomes smaller (step 54) the current mirroring ratio is modified to increase the biasing current in step 55. If the input voltage difference becomes larger instead (step 54) the current mirroring ratio is modified to reduce the biasing current in step 58. The comparator circuit compares the voltage of said two input signals (step 57) and as soon as the comparator input signals cross the zero difference point (step 58), it switches the output according to the input's polarity and then, in step 59, the circuit alternates the connection of each of the two input signals to the controlling inputs of the circuit arrangement, that modifies the current mirroring ratio.

Figure 3A:
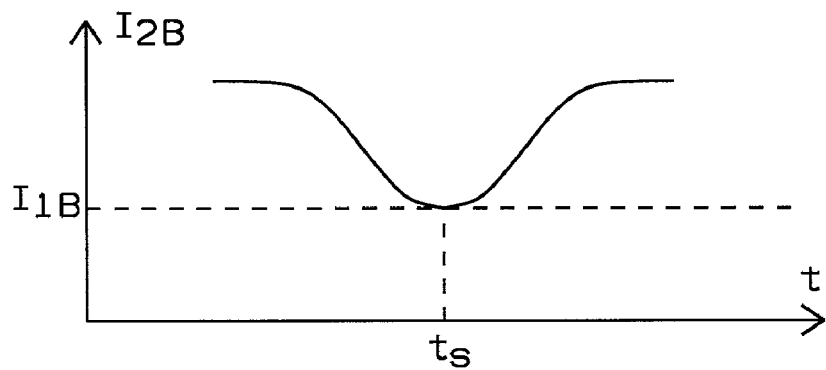
FIGS. 3a and 3b show the resulting biasing current $I_2$ versus the input voltage difference of signals $V_1$ and $V_2$, when the switching sequence is selected to produce a minimum current when the difference at signals $V_1$ and $V_2$ approaches zero.
Figure 3B:
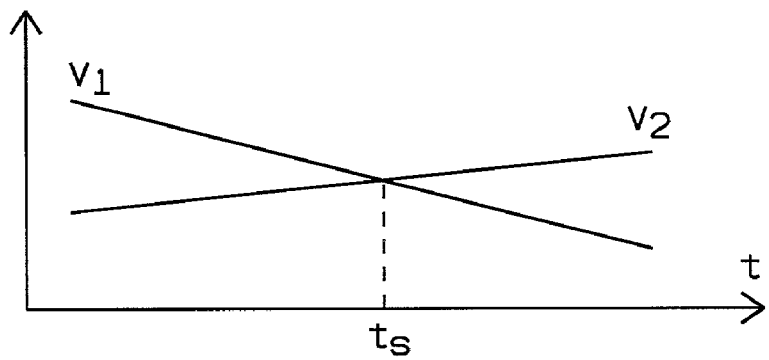

In addition to the above invention, the preferred embodiments also disclose, as a second embodiment, a novel method and circuit to feed a high biasing current to said CMOS comparator only when the voltage difference of the two inputs is large and reduces said biasing current significantly at other times. The behavior of this embodiment is opposite to the behavior, of the first embodiment: when the smaller input signal is always connected to $N_3$, an effective "current boost" is realized when the voltage difference of the input signals to the comparator is large. This characteristic is shown in FIG. 3a and FIG. 3b. To achieve this opposite behavior, said switches to alternate the connection of $V_1$ and $V_2$ with $N_3$ and $N_4$ are just reversed to the way as described in the first embodiment.

Figure 4:
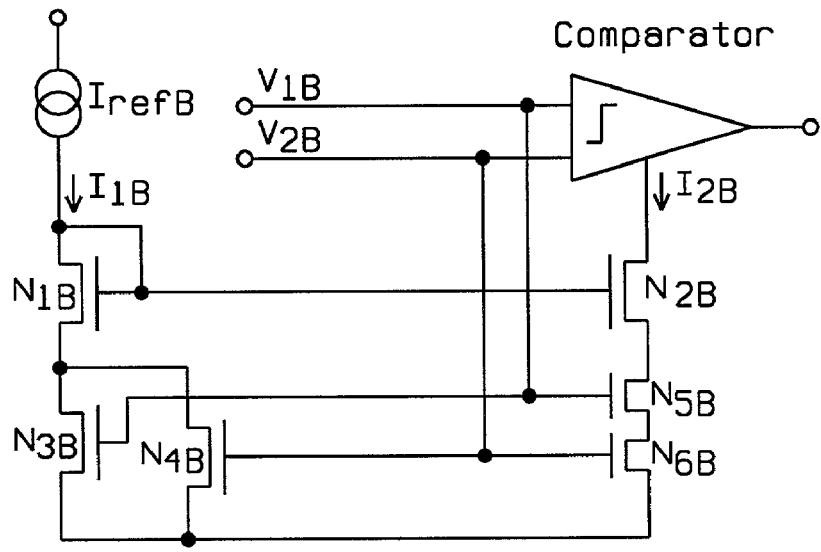
FIG. 4 shows an alternative circuit diagram, very similar in function as the circuit of FIG. 1, where the biasing current is a maximum when the input voltages approach the zero difference.

A third embodiment to achieve the first described objective is shown in FIG. 4. The controllable current source $I_{2B}$ (similar to $I_2$ in FIG. 1) will feed the biasing current into the comparator, where the current of said current source would be controlled by a circuit on the basis of the voltage difference of said comparator inputs.

Biasing current should again have its maximum when the voltage difference of the two input signals is low, regardless of the polarity of the difference. This characteristic of the biasing current versus input voltage difference is similar to FIG. 2a and FIG. 2b.

As in the circuit described in the first embodiment, the current mirror forms the heart of the circuit and mirrors a reference current into an output current, either of equal value, or with a defined multiple of the reference current.

Again, voltage controlled resistive elements in series with each branch of the current mirror change the characteristics of the current mirror. A parallel arrangement of two voltage controlled resistive elements within the reference current branch of said current minor and a serial arrangement of two voltage controlled resistive elements within the biasing current branch of said current mirror, build the controlling elements of said current mirror. All of said voltage controlled resistive elements are controlled by coupling them to the two input signals of the fast switching comparator, in a way, that, when an input signal changes relative to the other, the balance of the current mirror will change, specifically, when the voltage difference of both signals gets smaller, said biasing current will increase. However when both input signals change in common mode, the current mirror's balance remains unchanged.

FIG. 4 shows a reference current source $I_{ref}$ and a current mirror, built by the matched transistor pair $N_{1B}$ and $N_{2B}$, which receives the reference current as current $I_{1B}$ in one branch and mirrors it into the other branch as $I_{2B}$.

In the circuit of FIG. 4, the FET transistor $N_3$ of FIG. 1 is replaced by two FET transistors $N_{3B}$ and $N_{4B}$ connected in parallel and the FET transistor $N_4$ of FIG. 1 is replaced by two FET transistors $N_{5B}$ and $N_{6B}$ connected in series. All FET transistors $N_{3B}$ through $N_{6B}$ operate as voltage controlled resistors. They change the mirroring ratio of the current mirror. The gates of transistors $N_{3B}$ and $N_{6B}$ are connected to the input signal $V_{1B}$ and the gates of transistors $N_{4B}$ and $N_{5B}$ are connected to the input signal $V_{2B}$.

Transistor pairs $N_{3B}$ and $N_{4B}$, connected in parallel, and transistor pairs $N_{5B}$ and $N_{6B}$, connected in series, serve two major purposes in the circuit as described in this invention according to FIG. 4: they are the elements to control the current mirror ratio and they are, at the same time, the sensing elements for the input signal difference, thus being able to achieve the desired circuit function of significant biasing current reduction with a minimum of components. However transistor pairs $N_{3B}/N_{4B}$ and $N_{5B}/N_{6B}$ may also be built by more complex arrangements of components.

While the invention has been particularly shown and described with reference to the preferred embodiments thereof, it will be understood by those skilled in the art that various changes in form and details may be made without departing from the spirit and scope of the invention.

What is claimed is:

1. A circuit to supply a variable biasing current to a fast switching comparator, where said biasing current has its maximum when a voltage difference of said fast switching comparator's two input signals is zero, in order to achieve fast switching characteristics of said fast switching comparator, and where said biasing current is reduced at all other times, to achieve overall reduced power consumption, comprising:

a current source for providing a reference current, building a key element of a reference current branch of a current mirror;

said current mirror for mirroring said reference current from said reference current branch into a second current branch of said current mirror, called a biasing current branch, and resulting in a current mirror output current, which is equivalent to said reference current multiplied by a current mirroring ratio of the current mirror and which said biasing current branch of said current mirror then feeds to said fast switching comparator as said biasing current;

a circuit arrangement to modify the current mirroring ratio of said current mirror, connected in series with said two branches of the current mirror and controlled by two signals operating as two ratio controlling inputs in order to modify said current mirroring ratio, then resulting in said biasing current being modified to a value, which is equivalent to said reference current multiplied by said modified current mirroring ratio;

a connection circuit to connect said two fast switching comparator input signals to said two ratio controlling inputs of said circuit arrangement to modify the current mirroring ratio, which modifies the current mirroring ratio in a way so that said biasing current is reduced, when said voltage difference of said two input signals increases and that said biasing current is increased when said voltage difference of said two input signals decreases until said voltage difference of said two input signals is zero, wherein said connection circuit comprising:

an alternating mechanism alternating a connection of said two input signals and said two ratio controlling inputs of said circuit arrangement to modify the current mirroring ratio;

means to control said alternating mechanism to select a direction of change of said current mirroring ratio, based on a signal indicating a polarity of said voltage difference of said two input signals; and means to determine a status of a comparison of said two input signals and providing said signal indicating the polarity of said voltage difference of said two input signals to said means to control said alternating mechanism.

2. The circuit of claim 1 wherein said means to determine the status of a comparison of said two input signals takes said fast switching comparator's output status as the signal of said polarity of said two input signals' voltage difference.

3. The circuit of claim 1 wherein said current mirror is built by an arrangement of FET-Transistors.

4. The circuit of claim 1 wherein said circuit arrangement to modify the current mirroring ratio primarily comprise voltage controlled resistive elements which allow to modify the current mirroring ratio and whom each of said voltage controlled resistive elements has a ratio controlling input.

5. The circuit of claim 4 wherein said voltage controlled resistive elements which allow to modify the current mirroring ratio are each built by an arrangement of FET-Transistors.

6. The circuit of claim 4, wherein, at one time, said two input signals are connected to either one of said ratio controlling inputs of said voltage controlled resistive elements, which allow to modify the current mirroring ratio, in a way so that, while bald two input signals have different voltage levels, said biasing current is smaller than said reference current.

7. The circuit of claim 1 wherein, once said two input signals' voltage difference passes zero and said voltage difference then further increases, said alternating mechanism reverses the direction of change of said current mirroring ratio in order to make said biasing current again smaller than said reference current.

8. The circuit of claim 1 wherein said means to determine the status of a comparison of said two input signals, is a comparator circuit integrated within the circuit to supply a variable biasing current to a fast switching comparator.

9. A circuit to supply a variable biasing current for a fast switching CMOS comparator where said biasing current has its maximum when a voltage difference of said fast switching CMOS comparator's two input signals is zero, in order to achieve fast switching characteristics of said fast switching CMOS comparator and where said biasing current is reduced at all other times to achieve overall reduced power consumption, comprising:
  a current source for providing a reference current, building a key element of a reference current branch of a current mirror;
  said current mirror, typically built by pairs of transistors, to mirror said reference current from said reference current branch into a second current branch of said current mirror, called a biasing current branch, and resulting in a current mirror output current, which is equivalent to said reference current multiplied by a current mirroring ratio of the current mirror and which said biasing current branch of said current mirror then feeds to said fast switching CMOS comparator as said biasing current;
  two voltage controlled resistive elements to modify the current mirroring ratio of said current mirror, a first of said voltage controlled resistive elements connected in series with said reference current branch and a second of said voltage controlled resistive elements connected in series with said biasing current branch, where the resistance of each of said two resistive elements is controlled by a signal operating as one of two ratio controlling inputs of said voltage controlled resistive elements;
  a connection circuit to connect said two input signals to said two ratio controlling inputs of said first and second voltage controlled resistive elements, which modify the current mirroring ratio in a way, that the biasing current is reduced, when said two input signals' voltage difference increases and that said biasing current is increased when said two input signals' voltage difference decreases until said two input signals' voltage difference is zero, wherein said connection circuit comprising:
    a matrix of switching elements, to alternate a connection of said two input signals and said two ratio controlling inputs of said two resistive elements, in order to always drive said biasing current smaller than said reference current, while said two input signals have different levels;
    a control circuit to control said matrix of switching elements, to alternate the connection between said two input signals and said two ratio controlling inputs of said two voltage controlled resistive elements, based on a signal indicating a polarity of said two input signals' voltage difference; and
    a polarity indicating circuit, to provide the signal, indicating a polarity of said two input signals' voltage difference, to said control circuit to control said matrix of switching elements.

10. The circuit of claim 9, wherein said voltage controlled resistive elements to modify the current mirroring ratio are formed by an arrangement of FET transistors.

11. The circuit of claim 9, wherein said matrix of switching elements for an alternating mechanism is formed by an arrangement of FET transistors.

12. The circuit of claim 9 wherein said polarity indicating circuit to provide the signal indicating a polarity of said two input signals, is a voltage comparator which is integrated within the circuit to supply a variable biasing current to a fast switching CMOS comparator.

13. The circuit of claim 9 wherein said polarity indicating circuit to provide a signal indicating a polarity of said two input signals, takes said fast switching CMOS comparator's output status as the signal of said polarity.

14. The circuit of claim 9, wherein, at one time, said two input signals are connected to either one of said two voltage controlled resistive elements, which allow to modify the current mirroring ratio, in a way so that, while said fast switching CMOS comparator input signals have different levels, said biasing current is smaller than said reference current.

15. The circuit of claim 9 wherein, once said two input signals' voltage difference passes zero and the voltage difference of said two input signals then further increases, said matrix of switching elements exchanges the connection of said two input signals to said two ratio controlling inputs, in order to make said biasing current again smaller than said reference current.

16. The circuit of claim 9 wherein said control circuit to control said matrix of switching elements, based on the polarity of said two input signals' voltage difference, comprises its own voltage comparator, determining the polarity of said two input signals' voltage difference, In order to selects said direction of change of said current mirroring ratio.

17. The circuit of claim 9 wherein said control circuit to control said matrix of switching elements, based on the polarity of said fast switching CMOS comparator input signals' voltage difference, comprises a means to couple to said fast switching CMOS comparator output signal in order to use said fast switching comparator's output status to selects said direction of change of said current mirroring ratio.

18. A method of feeding a variable biasing current to a fast switching comparator where said biasing current reaches its maximum when a voltage difference of said fast switching comparator's two input signals approaches zero, in order to achieve fast switching characteristics of said fast switching comparator, and where said biasing current is reduced at all other times, to achieve overall reduced power consumption, comprising:
  providing a current source for providing a reference current, building a key element of a reference current branch of a current mirror, said current mirror to mirror said reference current from said reference current branch into a second current branch of said current mirror, called a biasing current branch, and resulting in a mirrored current, which is equivalent to said reference current multiplied by a current mirroring ratio of the current mirror, and feeding said mirrored current to said fast switching comparator as said fast switching comparator's biasing current, a circuit arrangement to modify the current mirroring ratio of said current mirror, typically implemented as voltage controlled resistive elements, like arrangements of FET transistors, and having two ratio controlling inputs, a connection circuit to connect said two input signals to said two ratio controlling inputs of said circuit arrangement to modify the current mirroring ratio, wherein said connection circuit comprising an alternating mechanism to select, which of said two input signals is connected to which of said two ratio controlling inputs, and a control circuit to determine a status of said alternating mechanism based on a polarity of said voltage difference of said two input signals;

comparing the voltage of said two input signals and providing a status signal according to the polarity of said two input signals' voltage difference;

mirroring said reference current from said reference current branch into the biasing current branch which has either a one to one relationship to said reference current or which otherwise has a fixed ratio to said reference current;

feeding said mirrored current into said fast switching comparator as the fast switching comparator's biasing current;

modifying said current mirroring ratio, in order to increase said biasing current when said two input signals' voltage difference becomes smaller and to reduce the biasing current when said two input signals' voltage difference becomes larger;

producing an unmodified mirroring ratio when the voltage difference of said two input signals is zero, wherein at this point the current minor is defined to be in balance and where said mirrored current is equal to the desired maximum of said biasing current;

connecting said two input signals to said two ratio controlling inputs in such a way to achieve an increasing biasing current when said voltage difference of said two input signals decreases;

alternating said connection of said two input signals to said two ratio controlling inputs, when the polarity of said two input signals' voltage difference changes; and selecting a proper status of said connection between said two input signals and said two ratio controlling inputs based on said status signal according to the polarity of said two input signals' voltage difference.

19. The method of claim 18 wherein increasing said current mirroring ratio is achieved by increasing the resistance of a first voltage controlled resistive element, which is connected in series with said reference current branch of said current minor and by reducing the resistance of a second voltage controlled resistive element, which is connected in series with said biasing current branch of said current mirror.

20. The method of claim 18 wherein reducing said current mirroring ratio is achieved by reducing the resistance of a first voltage controlled resistive element, which is connected in series with said reference current branch of said current mirror and by increasing the resistance of a second voltage controlled resistive element, which is connected in series with said biasing current branch of said current mirror.

21. The method of claim 20 wherein both voltage controlled resistive elements, which are connected in series with the two branches of said current mirror, are in balance at the point in time, where the voltage difference of the two fast switching comparator input signals reaches zero and where said mirrored current is equal to the desired maximum of said biasing current.

22. The method of claim 18 wherein comparing the voltage of the two fast switching comparator input signals and providing a status signal according to the polarity of said two input signal's voltage difference is done with a comparing function built into said means to determine a status of said alternating mechanism.

23. The method of claim 18 wherein comparing the voltage of the two fast switching comparator input signals and providing a status signal according to the polarity of said two input signal's voltage difference uses the output status of said fast switching comparator to determine said polarity.

24. A circuit to supply a variable biasing current for a voltage comparator with overall reduced power consumption and where the biasing current supplied to said voltage comparator has its maximum when a voltage difference of said voltage comparator's two input signals is close to said comparators full operating range and where said biasing current has its minimum when said voltage difference of said two input signals is zero, comprising:

a current source for providing a reference current, building a key element of a reference current branch of a current mirror;

said current mirror for mirroring said reference current from said reference current branch into a second current branch of said current mirror called a biasing current branch, and resulting in a current mirror output current, which is equivalent to said reference current multiplied by a current mirroring ratio of the current mirror and which said biasing current branch of said current mirror then feeds to said voltage comparator as said biasing current;

a circuit arrangement to modify the current mirroring ratio of said current mirror, connected in series with said two branches of the current mirror and controlled by two signals operating as two ratio controlling inputs in order to modify said current mirroring ratio, then resulting in said biasing current being modified to a value, which is equivalent to said reference current multiplied by said modified current mirroring ratio;

a connection circuit to connect said two voltage comparator input signals to said two ratio controlling inputs of said circuit arrangement to modify the current mirroring ratio in a way so that said biasing current increases, when said voltage difference of said two input signals increases and that the biasing current decreases, when said voltage difference of said two input signals decreases, wherein said connection circuit comprising an alternating mechanism to select, which of said two input signals is connected to which of said two ratio controlling inputs, means to control said alternating mechanism to change a connection between sold two input signals and said two ratio controlling inputs, based on a signal indicating a polarity of said voltage difference of said two input signals; and means to determine a status of a comparison of said two input signals and providing said signal indicating the polarity of said voltage difference of said two input signals to said means to control said alternating mechanism.

25. The circuit of claim 24 wherein said means to determine the status of a comparison of said two input signals, determining the polarity of said two input signals' voltage difference, is a circuit integrated within the circuit to supply a variable biasing current for a voltage comparator.

26. The circuit of claim 24 wherein said current mirror is built by an arrangement of FET-Transistors.

27. The circuit of claim 24 wherein said circuit arrangement to modify the current mirroring ratio primarily comprises voltage controlled resistive elements, which allow to modify the current mirroring ratio.

28. The circuit of claim 27 wherein said two voltage controlled resistive elements, which allow to modify the current mirroring ratio are each built by an arrangement of FET-Transistors.

29. The circuit of claim 24 wherein said means to determine the status of a comparison of said two input signals takes said voltage comparator's output status as the signal of said polarity of said two input signals' voltage difference.

30. The circuit of claim 24 wherein, once said two input signals' voltage difference passes zero and said voltage difference of said two input signals then further increases, said alternating mechanism reverses the direction of change of said current mirroring ratio in order to make said biasing current again larger than said reference current.

31. The circuit of claim 24 wherein said means to control said alternating mechanism, based on a signal indicating the polarity of said voltage difference of said voltage comparator input signals, comprises its own voltage comparator, determining the polarity of said two input signals' voltage difference, in order to selects said direction of change of said current mirroring ratio.

32. The circuit of claim 24 wherein said means to control said alternating mechanism, based on a signal to indicate the polarity of said voltage difference of said two input signals, comprises a means to couple to said voltage comparator output signal in order to use said voltage comparator's output status to selects said direction of change of said current mirroring ratio.

33. A circuit to supply a variable biasing current for a CMOS comparator with overall reduced power consumption and where said biasing current has its maximum when a voltage difference of said CMOS comparators two input signals is close to said operator's full operating range and has its minimum when said voltage difference of said CMOS comparator's two input signals is zero, comprising:
  a current source for providing a reference current, building a key element of the reference current branch of a current mirror:
  said current mirror, typically built by pairs of transistors, to mirror said reference current from said reference current branch into a second current branch of said current mirror, called a biasing current branch, and resulting in a current mirror output current, which is equivalent to said reference current multiplied by a current mirroring ratio of the current mirror and which said biasing current branch of said current mirror provides to said fast switching CMOS comparator as said biasing current;
  two voltage controlled resistive elements to modify the current mirroring ratio, a first of said voltage controlled resistive elements connected in series with said reference current branch and a second of said voltage controlled resistive elements connected in series with said biasing current branch, where the resistance of both of said two resistive elements is controlled by a signal applied to a ratio controlling input of said voltage controlled resistive element and derived from said two input signals;
  a connection circuit to connect said two input signals to said two ratio controlling inputs of said first and second voltage controlled resistive elements, which modify the current mirroring ratio in a way, that the biasing current increases, when said voltage difference of said two input signals increases and that said biasing current is reduced when said voltage difference of said two input signals is decreasing, until said voltage difference of said two input signals is zero, wherein said connection circuit comprising:
  a matrix of switching elements, to alternate a connection of said two input signals and said two ratio controlling inputs of said two resistive elements, which modify said current mirroring ratio;
  a control circuit to control said matrix of switching elements, to alternate a connection between said two input signals and said two voltage controlled resistive elements, based on a polarity of said two input signals' voltage difference.

34. A circuit of claim 33, where the voltage controlled resistive elements to modify the current mirroring ratio are formed by an arrangement of FET transistors.

35. A circuit of claim 33, where the matrix of switching elements for an alternating mechanism is formed by an arrangement of FET transistors.

36. The circuit of claim 33, wherein, at one time, said CMOS comparator input signals are connected to either one of said two voltage controlled resistive elements, which allow to modify the current mirroring ratio, in a way so that, while said CMOS comparator input signals have different levels, said biasing current is larger than said reference current.

37. The circuit of claim 33 wherein, once said two input signals' voltage difference passes zero and the voltage difference of said two input signals then further increases, said matrix of switching elements exchanges the connection of said CMOS comparator input signals to said two ratio controlling inputs, in order to make said biasing current again larger than said reference current.

38. The circuit of claim 33 wherein said control circuit to control said matrix of switching elements, based on the polarity of said two input signals' voltage difference, comprises its own voltage comparator, determining the polarity of said two input signals' voltage difference, in order to select said direction of change of said current mirroring ratio.

39. The circuit of claim 33 wherein said control circuit to control said matrix of switching elements, based on the polarity of said CMOS comparator input signals' voltage difference, comprises a means to couple to said CMOS comparator output signal in order to use said voltage comparator's output status to selects said direction of change of said current mirroring ratio.

40. A method of feeding a variable biasing current to a CMOS comparator where said biasing current has its maximum when a voltage difference of said CMOS comparator's two input signals is close to said comparator's full operating range and where said biasing current reaches its minimum when said voltage difference is zero, comprising:
  providing a current source for providing a reference current, building a key element of a reference current branch of a current mirror, said current minor to mirror said reference current from said reference current branch into a second current branch of said current mirror, called a biasing current branch, and resulting in a mirrored current, which is equivalent to said reference current multiplied by a current mirroring ratio of the current mirror, and providing said second current to said CMOS comparator as said CMOS comparators biasing current, a circuit arrangement to modify the current mirroring ratio of said current mirror, typically implemented as voltage controlled resistive elements and having two ratio controlling inputs, a connection circuit to connect said two input signals to said ratio controlling inputs of said circuit arrangement to modify the current mirroring ratio, wherein said connection circuit comprising an alternating mechanism to select, which of said two input signals is connected to which of said two ratio controlling inputs, and means to control a status of said alternating mechanism based on a polarity of said voltage difference of said two input signals;

comparing the voltage of said two input signals and providing a status signal according to the polarity of said two input signals' voltage difference;

mirroring said reference current from said reference current branch into said biasing current branch which has either a one to one relationship to said reference current or which otherwise has a fixed ratio to said reference current;

feeding said mirrored current into said CMOS comparator as said CMOS comparator's biasing current;

modifying said current mirroring ratio, in order to increase said biasing current when said two input signals' voltage difference becomes larger and to reduce the biasing current when said two input signals voltage difference becomes smaller;

producing an unmodified mirroring ratio when the voltage difference of both said two input signals is zero, wherein at this point the current mirror is defined to be in balance and said mirrored current is equal to the desired minimum of said biasing current;

connecting said two input signals to said two ratio controlling inputs in such a way to achieve a decreasing biasing current when said two input signals' voltage difference decreases;

alternating a connection of said two input signals to said two ratio controlling inputs, when the polarity of said two input signals' voltage difference changes; and selecting a proper status of said connection between said two input signals and said two ratio controlling inputs, based on said status signal according to the polarity of said two input signals' voltage difference.

41. The method of claim 40 wherein reducing said current mirroring ratio is achieved by reducing the resistance of a first voltage controlled resistive element, which is connected in series with said reference current branch of said current mirror and by increasing the resistance of a second voltage controlled resistive element, which is connected in series with said biasing current branch of said current mirror.

42. The method of claim 40 wherein increasing said current mirroring ratio is achieved by increasing the resistance of a first voltage controlled resistive element, which is connected in series with the first branch of said current mirror and by reducing the resistance of a second voltage controlled resistive element, which is connected in series with the biasing current branch of said current mirror.

43. The method of claim 42 wherein both voltage controlled resistive elements, which are connected in series with the two branches of said current mirror, are in balance at the point in time, where the voltage difference of the two CMOS comparator input signals reaches zero and where said mirrored current is equal to the desired minimum of said biasing current.

44. The method of claim 40 wherein comparing the voltage of said two input signals and providing a status signal according to the polarity of said two input signals voltage difference is done with a comparing function built into said alternating mechanism.

45. The method of claim 40 wherein, comparing the voltage of said two CMOS comparator input signals and providing a status signal according to the polarity of said two input signal's voltage difference uses the output status of said CMOS comparator.

46. A circuit to supply a variable biasing current for a fast switching comparator with overall reduced power consumption and where said biasing current has its maximum when a voltage difference of said fast switching comparator's two input signals is zero, and where said biasing current is reduced at all other times, to achieve overall reduced power consumption, comprising:

a current source for providing a reference current, building the key element of a reference current branch of a current mirror;

said current mirror for mirroring said reference current from said reference current branch into a second current branch of said current mirror, called a biasing current branch, and resulting in a current mirror output currents which is equivalent to said reference current multiplied by a current mirroring ratio of the current mirror and which said biasing current branch of said current mirror feeds to said fast switching comparator as said biasing current;

a first circuit arrangement to modify the current mirroring ratio of said current mirror, connected in series with said reference current branch of said current mirror and controlled by signals applied to two ratio controlling inputs, and a second circuit arrangement to modify the current mirroring ratio, connected in series with the biasing current branch of said current mirror and again controlled by signals applied to two ratio controlling inputs; and a connection circuit to connect both of said fast switching comparator's input signals to both of said ratio controlling inputs of said first and of said second circuit arrangement to modify the current mirroring ratio.

47. The circuit of claim 46 wherein said first and second circuit arrangement to modify the current mirroring ratio primarily comprise two arrangements of voltage controlled resistive elements which allow to modify the current mirroring ratio, one within said reference current branch and the second within said biasing current branch.

48. The circuit of claim 46 wherein said means to mirror said reference current is built by an arrangement of FET-Transistors.

49. The circuit of claim 46 wherein said first and second circuit arrangements to modify the current mirroring ratio are built by arrangements of FET-Transistors, which operate as two sets of voltage controlled resistive elements.

50. A circuit to supply a variable biasing current for a fast switching CMOS comparator, where said biasing current has its maximum when a voltage difference of said fast switching CMOS comparator's two input signals is zero, in order to achieve fast switching characteristics of said fast switching CMOS comparator and where said biasing current is reduced at all other times to achieve overall reduced power consumption, comprising:

a current source for providing a reference current, building a key element of a reference current branch of a current mirror;

said current mirror, typically built by pairs of transistors, to mirror said reference current from said reference current branch into a second current branch of said current mirror, called a biasing current branch and resulting in a current mirror output current, which is equivalent to said reference current multiplied by a current mirroring ratio of the current mirror and which said biasing current branch of said current mirror then feeds to said fast switching CMOS comparator as said biasing current; and four voltage controlled resistive elements to modify said current mirroring ratio, each having a ratio controlling input, a first resistive element of said four voltage controlled resistive elements connected in series with said reference current branch of said current mirror and with its ratio controlling input connected with the first input of said fast switching CMOS comparator and a second resistive element of said four voltage controlled resistive elements, equally connected in series within said reference current branch of said current mirror and in parallel to said first resistive element, and with its ratio controlling input connected with the second input of said fast switching CMOS comparator and a third resistive element of said four voltage controlled resistive elements, connected in series with said biasing current branch of said current mirror and with its ratio controlling input connected with said first input of said fast switching CMOS comparator and a fourth voltage controlled resistive element, connected in series with said third resistive element, connected in series with said biasing current branch of said current mirror and also connected with its ratio controlling input to said second input of the fast switching CMOS comparator.

51. The circuit of claim 50, where each of the voltage controlled resistive elements to modify the current mirroring ratio are formed by an arrangement of FET transistors.

52. A method to supply a variable biasing current to a fast switching CMOS comparator, where said biasing current has its maximum when the input voltage difference at the fast switching CMOS comparator's two input signals is zero, comprising:

providing a current source for providing a reference current, building a key element of a reference current branch of a current mirror, said current mirror to mirror said reference current from said reference current branch into a second current branch of said current mirror, called the biasing current branch, and resulting in a mirrored current, which is equivalent to said reference current multiplied by a mirrored current mirroring ratio of the current mirror, a connection to feed the mirrored current of said biasing current branch into said fast switching CMOS comparator circuit as its biasing current, and an arrangement of four voltage controlled resistive elements, each having a ratio controlling input, coupled to one of said two input signals, where two of said four voltage controlled resistive elements are arranged in parallel within said reference current branch and where two of said four voltage controlled resistive elements are arranged in series within said biasing current branch;

mirroring said reference current from said reference current branch into said biasing current branch resulting in the mirrored current which is equal to or a predefined multiple of said reference current;

feeding said mirrored current into said fast switching CMOS comparator circuit as said fast switching CMOS comparator's biasing current;

modifying said current mirroring ratio by a parallel arrangement of a first and second of said voltage controlled resistive elements within said reference current branch of said current mirror and by a serial arrangement of a third and fourth of said voltage controlled resistive elements within said biasing current branch of said current mirror, where all of these four voltage controlled resistive elements are controlled through said two input signals; and connecting one of said two input signals to said ratio controlling inputs of said first and third voltage controlled elements and connecting the second of said two input signals to said ratio controlling inputs of said second and fourth voltage controlled elements in order to reduce the biasing current, when said voltage difference of said two input signals increases and to increase said biasing current when said voltage difference of said two input signals decreases until said voltage difference of said two input signals approaches zero.

53. The method of claim 52 wherein reducing said current mirroring ratio is achieved by reducing the resistance of one of said first and second voltage controlled resistive elements, which are connected in parallel within said reference current branch of said current mirror and by increasing the resistance of one of said third and fourth voltage controlled resistive elements, which are connected in series within said biasing current branch of said current mirror.

54. The method of claim 52 wherein increasing said current mirroring ratio is achieved by increasing the resistance of one of said first and second voltage controlled resistive elements, which are connected in parallel within said reference current branch of said current mirror and by reducing the resistance of one of said third and fourth voltage controlled resistive elements, which are connected in series within said biasing current branch of said current mirror.

55. The method of claim 54 wherein said parallel arrangement of said first and second voltage controlled resistive elements within said reference current branch of said current mirror and said serial arrangement of said third and fourth voltage controlled resistive elements within said biasing current branch of said current mirror are in balance at the point in time, where the voltage difference of said input signals reaches zero and where said mirrored current is equal to the desired maximum of said biasing current.

* * * * *